United States Patent
Gubbins et al.

(10) Patent No.: US 9,595,274 B2
(45) Date of Patent: Mar. 14, 2017

(54) CRYSTALLINE MAGNETIC LAYER TO AMORPHOUS SUBSTRATE BONDING

(71) Applicant: Seagate Technology LLC, Cupertino, CA (US)

(72) Inventors: Mark Anthony Gubbins, Letterkenny (IE); Marcus Benedict Mooney, Quigleys Point (IE)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/811,303

(22) Filed: Jul. 28, 2015

(65) Prior Publication Data

US 2015/0332710 A1    Nov. 19, 2015

Related U.S. Application Data

(62) Division of application No. 13/718,863, filed on Dec. 18, 2012, now Pat. No. 9,123,363.

(51) Int. Cl.
*G11B 5/31* (2006.01)
*B81C 1/00* (2006.01)
(Continued)

(52) U.S. Cl.
CPC .......... *G11B 5/3153* (2013.01); *G11B 5/3163* (2013.01); *G11B 5/3173* (2013.01); *B81C 1/0088* (2013.01); *B81C 1/00357* (2013.01); *B81C 1/00476* (2013.01); *B81C 3/001* (2013.01); *B81C 99/008* (2013.01); *B81C 2201/0194* (2013.01); *C09K 13/08* (2013.01); *C23F 1/02* (2013.01); *C23F 1/28* (2013.01);
*C23F 1/30* (2013.01); *C30B 25/04* (2013.01); *G03F 7/0002* (2013.01);
(Continued)

(58) Field of Classification Search
CPC ... G11B 5/3153; G11B 5/3173; G11B 5/3163; B81C 2201/0194; B81C 3/001; B81C 1/00476; B81C 1/00357; B81C 1/0088; B81C 99/008; G03F 7/0002; C30B 25/04; C09K 13/08; C23F 1/02; C23F 1/28; C23F 1/30; Y10T 428/11; Y10T 428/1171
See application file for complete search history.

(56) References Cited

U.S. PATENT DOCUMENTS 5,590,008 A    12/1996  Tanabe et al.
5,644,455 A    7/1997   Schultz
(Continued)

OTHER PUBLICATIONS

Meitl et al "Transfer printing by kinetic control of adhesion to an elastomeric stamp" Nature Materials, 5 (1) 33-38, published online Dec. 11, 2005.*

(Continued)

*Primary Examiner* — Anita Alanko
(74) *Attorney, Agent, or Firm* — Holzer Patel Drennan

(57) ABSTRACT

Various methods for attaching a crystalline write pole onto an amorphous substrate and the resulting structures are described in detail herein. Further, the resulting structure may have a magnetic moment exceeding 2.4 Tesla. Still further, methods for depositing an epitaxial crystalline write pole on a crystalline seed or template material to ensure that the phase of the write pole is consistent with the high moment phase of the template material are also described in detail herein.

17 Claims, 7 Drawing Sheets

(51) Int. Cl.
*B81C 3/00* (2006.01)
*B81C 99/00* (2010.01)
*C30B 25/04* (2006.01)
*G03F 7/00* (2006.01)
*C23F 1/02* (2006.01)
*C09K 13/08* (2006.01)
*C23F 1/28* (2006.01)
*C23F 1/30* (2006.01)

(52) U.S. Cl.
CPC .......... *Y10T 428/11* (2015.01); *Y10T 428/115* (2015.01); *Y10T 428/1157* (2015.01); *Y10T 428/1171* (2015.01); *Y10T 428/1186* (2015.01); *Y10T 428/1193* (2015.01)

(56) References Cited

U.S. PATENT DOCUMENTS

| | | |
|---|---|---|
| 6,168,860 B1 | 1/2001 | Daughton |
| 7,688,545 B1 | 3/2010 | Vas'Ko et al. |
| 7,799,592 B2 | 9/2010 | Lochtefeld |
| 2003/0133223 A1* | 7/2003 | Minor .................... B82Y 25/00 360/125.12 |
| 2003/0151852 A1* | 8/2003 | Sasaki .................. G11B 5/3163 360/125.59 |
| 2004/0166372 A1 | 8/2004 | Haginoya et al. |
| 2006/0098335 A1 | 5/2006 | Hirata et al. |
| 2008/0070355 A1 | 3/2008 | Lochtefeld et al. |
| 2009/0197121 A1 | 8/2009 | Inturi et al. |
| 2010/0321835 A1* | 12/2010 | Zhang .................... G11B 5/3116 360/319 |
| 2013/0316088 A1* | 11/2013 | Fujita ...................... G11B 5/84 427/526 |

OTHER PUBLICATIONS

Cheng et al., "Aspect Ratio Trapping Heteroepitaxy for Integration of Germanium and Compound Semiconductors on Silicon" Amber Wave System Corporation, Salem, NH, IEEE, 2008, 978-1-4244-2186-2/08, 4 pages.

Meitl et al., "Transfer printing by kinetic control of adhesion to an elastomeric stamp," natural materials, vol. 5, Jan. 2006, Nature Materials 5(1)33-38,Jan. 2006, published online Dec. 2005.

* cited by examiner

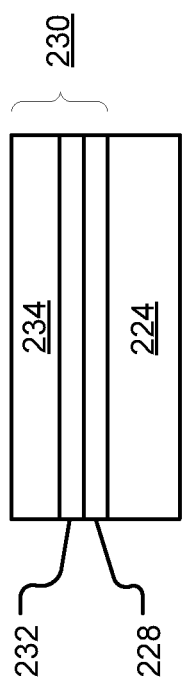
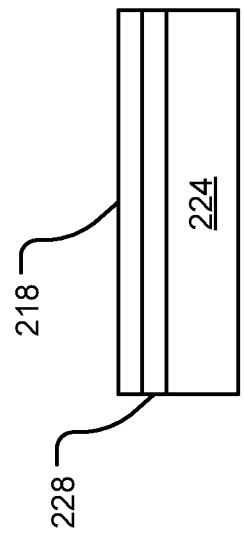
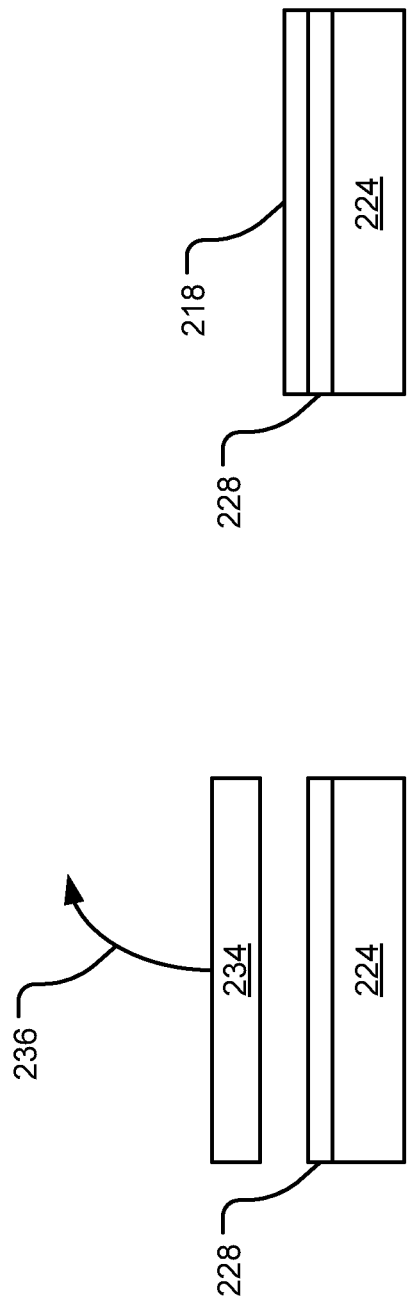

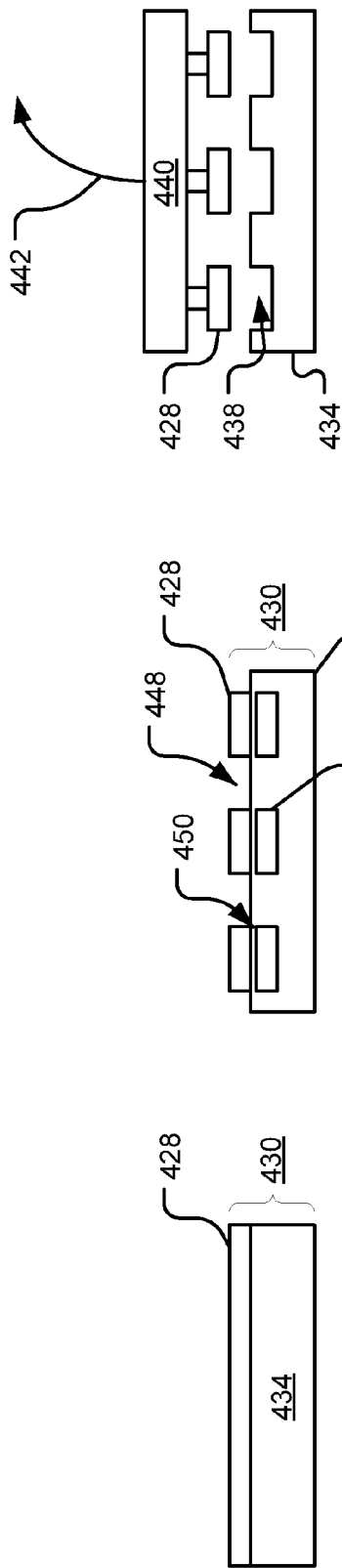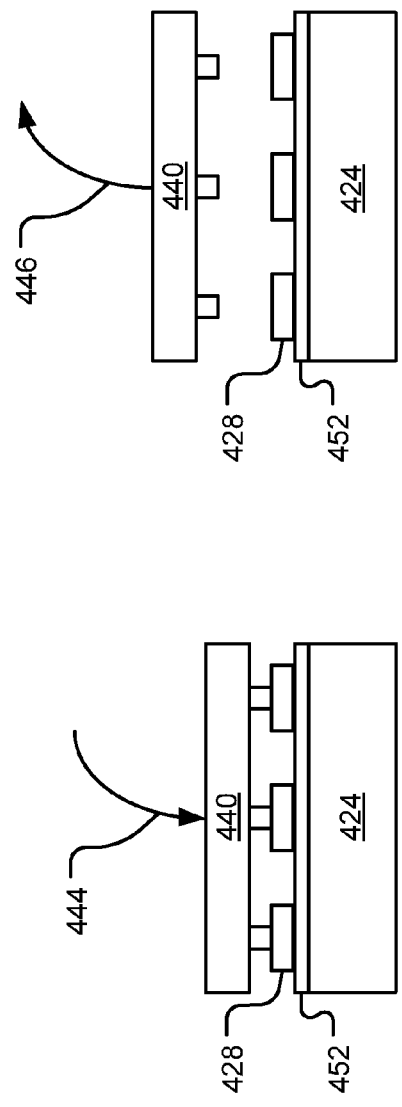

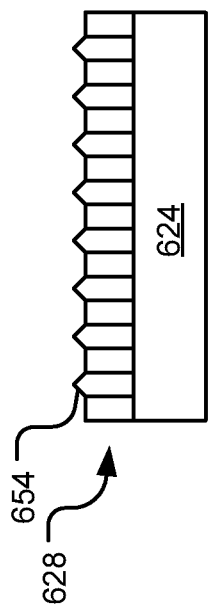
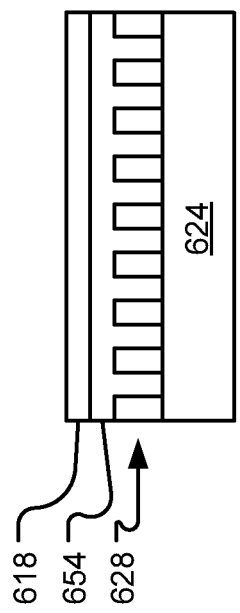
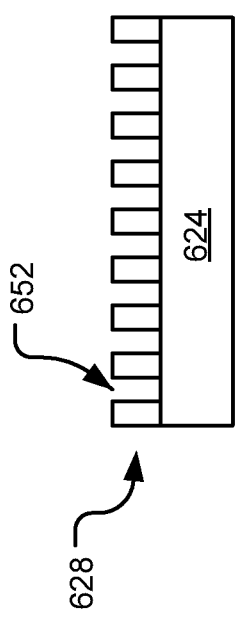
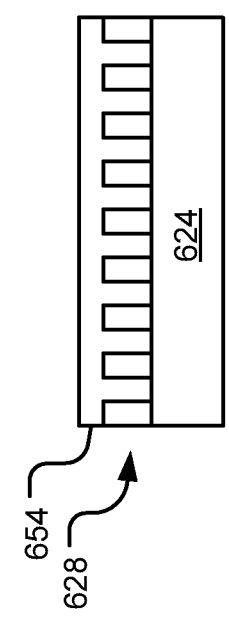

CRYSTALLINE MAGNETIC LAYER TO AMORPHOUS SUBSTRATE BONDING

CROSS-REFERENCE TO RELATED APPLICATION

This application is a divisional application of U.S. application Ser. No. 13/718,863 filed Dec. 18, 2012, now issued as U.S. Pat. No. 9,123,363, the entire disclosures of which are incorporated herein by reference for all purposes.

BACKGROUND

Advances in magnetic recording head technology are driven in large part by increasing the areal density of a recording media within a storage drive. As the areal density of the recording media increase, the dimensions of one or more write poles corresponding to the recording media decreases. Further, if all other factors are equal, the magnetic field generated by a write pole of diminishing size also diminishes. This increases the signal to noise ratio of the magnetic field generated by the write pole, which may be undesirable.

A major factor that controls the magnetic field generated by the write pole is the saturation flux density, or magnetic moment, of the write pole material. Providing a write pole material that has a higher magnetic moment allows the write pole to diminish in size and maintain a desired magnetic field magnitude. As a result, the write pole material is typically made of the highest magnetic moment material feasible given cost, performance, availability, and other constraints.

SUMMARY

Implementations described and claimed herein address the foregoing problems by providing an article of manufacture comprising an amorphous substrate and one or more epitaxial crystalline layers attached to the amorphous substrate, wherein a magnetic moment of the article of manufacture is greater than 2.4 Tesla.

Other implementations are also described and recited herein.

BRIEF DESCRIPTIONS OF THE DRAWINGS

FIG. 2A illustrates a side view of a crystalline template wafer bonded to an amorphous recording head wafer.

FIG. 2B illustrates a side view of the recording head wafer of FIG. 2A with the relatively thick crystalline template layer removed.

FIG. 2C illustrates a side view of the recording head wafer of FIG. 2B with an epitaxial magnetic write pole deposited thereon.

FIG. 4A illustrates a side view of a template wafer with a crystalline magnetic epitaxial layer deposited on a template crystalline substrate.

FIG. 4B illustrates a side view of the template wafer of FIG. 4A with the crystalline magnetic epitaxial layer patterned into islands with etching underneath.

FIG. 4C illustrates a side view of a flexible stamp attached to and pulling the individual islands of the crystalline magnetic epitaxial layer away from the template substrate of FIG. 4B.

FIG. 4D illustrates a side view of the flexible stamp placing the individual islands of the crystalline magnetic epitaxial layer of FIG. 4C onto a recording head wafer.

FIG. 4E illustrates a side view of the individual islands of the crystalline magnetic epitaxial layer bonded to an amorphous recording head wafer of FIG. 4D with the flexible stamp removed.

FIG. 6A illustrates a side view of a crystalline template layer bonded to an amorphous recording head wafer, the crystalline template layer having trenches patterned therein.

FIG. 6B illustrates a side view of the amorphous recording head wafer of FIG. 6A with the trenches in the crystalline template layer filled with a deposited crystalline template material.

FIG. 6C illustrates a side view of the amorphous recording head wafer of FIG. 6B with a deposited template layer covering the crystalline template layer.

FIG. 6D illustrates a side view of the recording head wafer of FIG. 6C with an epitaxial magnetic write pole deposited thereon.

DETAILED DESCRIPTIONS

Write poles are typically made of a polycrystalline or amorphous cobalt-iron alloys with a magnetic moment of up to 2.4 Tesla deposited on an aluminum oxide or aluminum titanium carbide amorphous substrate. An amorphous material is referred to herein as a solid that lacks the long-range order characteristic of a crystal. A polycrystalline material is referred to herein as a solid that is composed of many crystallites of varying size and orientation. The variation in orientation can be random or directed.

Some materials (e.g., iron nitride) attached to an amorphous substrate in crystalline form have may have a magnetic moment higher than 2.4 Tesla. A crystalline material is referred to herein as a solid material whose constituent atoms, molecules, or ions are arranged in an orderly, repeating pattern extending in all three spatial dimensions. Crystalline materials as referred to herein also include nearly crystalline materials that ideally are fully crystalline, but may have one or more defects where crystal's pattern is interrupted due to various defects (e.g., vacancy defects, interstitial defects, dislocations, impurities, dopants, twinning)

Further, rare earth-transition metal crystalline multilayers deposited in epitaxial layers (e.g., iron cobalt, chromium, and gadolinium multi-layers) may also have a magnetic moment higher than 2.4 Tesla. Utilizing prior techniques of depositing a polycrystalline or amorphous write pole to an amorphous substrate may not function adequately to attach a crystalline write pole to an amorphous substrate. An epitaxial layer is referred to herein as a crystalline overlayer on a crystalline substrate, where the overlayer is grown with a well-defined orientation with respect to the substrate crystalline structure. The epitaxial layer may be homo-epitaxial, hetero-epitaxial, or hetero-topotaxial.

Various methods for attaching a crystalline write pole onto an amorphous substrate and the resulting structures are described in detail below. Further, methods for depositing an epitaxial crystalline write pole on a crystalline seed or template material to ensure that the phase of the write pole is consistent with the high moment phase of the template material are also described in detail below. While the following methods and structures are specifically discussed in the context of attaching a crystalline write pole to an amorphous substrate, the following methods may be used to bond other crystalline components (e.g., a reader) to an amorphous substrate and create similar structures as those depicted herein.

Figure 1:
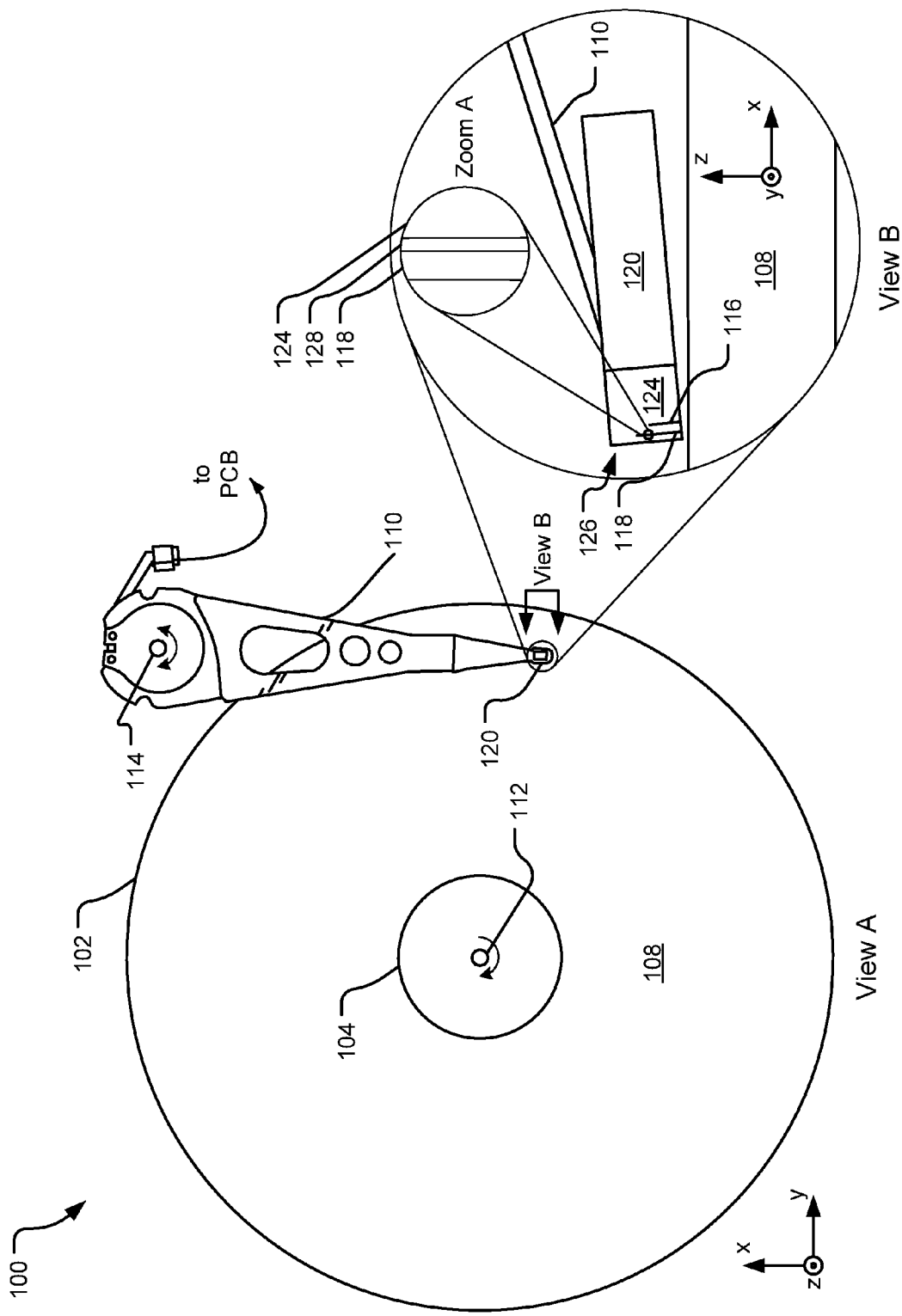
FIG. 1 illustrates an example disc drive assembly including a slider having a write pole manufactured according to the presently disclosed technology on a distal end of an actuator arm positioned over a storage media disc.

FIG. 1 illustrates an example disc drive assembly 100 including a slider 120 having a write pole 118 manufactured according to the presently disclosed technology on a distal end of an actuator arm 110 positioned over a storage media disc 108. In one implementation, referring specifically to View A of the x-y plane, the disc 108 includes an outer diameter 102 and an inner diameter 104 between which are a number of substantially circular data tracks. The disc 108 rotates at a high speed about disc axis of rotation 112 as information is written to and/or read from the data tracks on the disc 108. The information is stored in magnetic domains on the disc 108, which may be continuous (e.g., traditional magnetic storage media) or discrete (e.g., bit-patterned magnetic storage media), for example. In other implementations, the presently disclosed technology applies to semiconductor wafer structures independent from the disclosed disc drive assembly 100 and storage media disc 108.

The actuator arm 110 rotates about an actuator axis of rotation 114 during a seek operation to located a desired data track on the disc 108. The actuator arm 110 extends toward the disc 108, and at the distal end of the actuator arm 110 is the slider 120, which flies in close proximity above the disc 108 while reading and writing data to the disc 108. In other implementations, there is more than one slider 120, actuator arm 110, and/or disc 108 in the disc drive assembly 100.

A side view of the slider 120 is shown in detail in View B of the x-z plane of FIG. 1 and includes a reader 116 and a write pole 118 mounted on or within a substrate 124 (e.g., a recording head wafer) located at a trailing edge 126 of the slider 120. Other microelectronic components may also be mounted on the substrate 124 or on other areas of the slider 120. The appearances of the slider 120 and other features of assembly 100 are for illustration purposes only and not drawn to scale.

A zoomed-in view of the write pole 118 attached to the substrate 124 is shown in Zoom A in View B. The write pole 118 is crystalline and attached to the amorphous substrate 124. Attaching is referred to herein as encompassing various bonding techniques (e.g., gluing or direct-bonding), thin-film deposition, and any other way of attaching one structure to another structure. Since the crystalline write pole 118 typically would not deposit well directly to the amorphous substrate 124 (e.g., defects caused by the amorphous substrate 124 may propagate through the crystalline write pole 118, if directly deposited on the amorphous substrate 124), a crystalline template layer 128 (e.g., gallium arsenide) may be placed there between to provide a template from deposition of the write pole 118.

FIG. 2A illustrates a side view of a crystalline template wafer 230 bonded to an amorphous recording head wafer 224. The template wafer 230 includes two crystalline template layers 228, 234 with a release layer 232 there between. In one implementation, each of the crystalline template layers 228, 234 is composed of gallium arsenide. The relatively thick crystalline template layer 234 (e.g., 100-1000 µm, which scales with the wafer diameter) facilitates transportation of the relatively thin (e.g., 50-300 nm, which also scales with the wafer diameter) crystalline template layer 228 without damaging the crystalline template layer 228. Since the crystalline template layer 228 is to be merely used as a template for depositing an epitaxial crystalline magnetic layer (see epitaxial crystalline magnetic layer 218 of FIG. 2C), the crystalline template layer 228 is made as thin as possible.

The release layer 232 between the crystalline template layers 228, 234 facilitates separation of the relatively thick crystalline template layer 234 from the relatively thin crystalline template layer 228 without damaging the crystalline template layer 228. In one implementation, the release layer 232 is about 100 nm thick of $Al_xGa_{1-x}As$ with x being greater than 0.6. Further, the release layer 232 may be selectively etched without substantially etching the other layers using an aqueous hydrofluoric acid solution (e.g., at about 10% concentration).

The template wafer 230 is bonded to the amorphous recording head wafer 224 with the relatively thin crystalline template layer 228 in contact with the recording head wafer 224. The bonding may be assisted using an adhesive (e.g., epoxy resins like SU-8 or benzocyclobutene, not shown), heat and/or pressure. The template wafer 230 is then processed to dissolve or otherwise release the release layer 232 from the crystalline template layer 228 (e.g., via a wet chemical etching process).

FIG. 2B illustrates a side view of the recording head wafer 224 of FIG. 2A with the relatively thick crystalline template layer 234 removed. After the release layer 232 of FIG. 2A is dissolved or otherwise released, the crystalline template layer 234 may be removed from the recording head wafer 224 (as illustrated by arrow 236) while leaving the relatively thin crystalline template layer 228 bonded to the recording head wafer 224, intact and undamaged.

FIG. 2C illustrates a side view of the recording head wafer 224 of FIG. 2B with an epitaxial crystalline magnetic layer 218 (e.g., a write pole) deposited thereon. The crystalline template layer 228 may be used to deposit the epitaxial crystalline magnetic layer 218. The epitaxial crystalline magnetic layer 218 may be comprised of a 200 nm thick layer of iron nitride. In other implementations, the iron nitride layer may range from 100 nm to 500 nm thick. The technique illustrated by FIGS. 2A-2C may be referred to herein as a wafer-to-wafer bonding technique.

Figure 3:
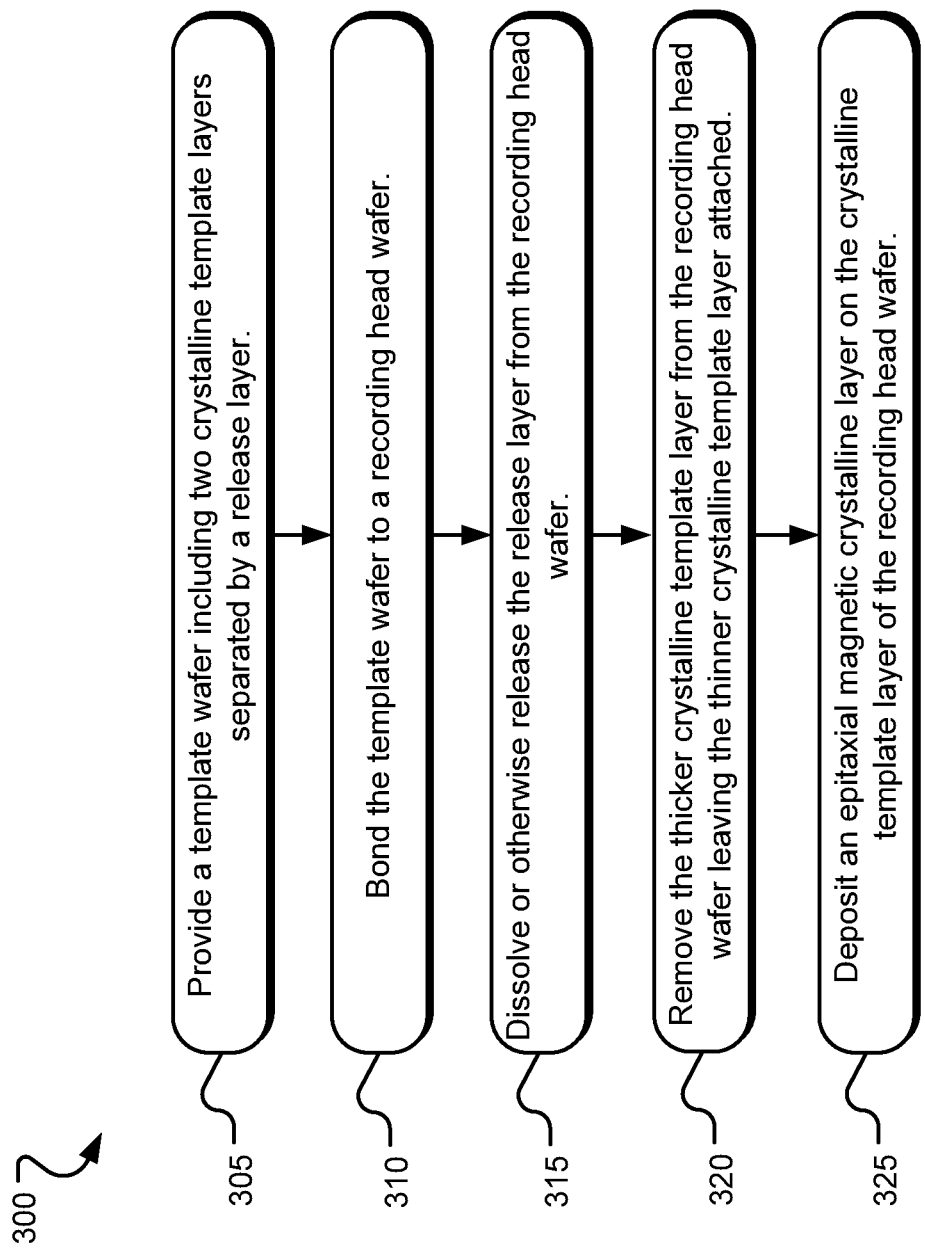
FIG. 3 illustrates operations for manufacturing a crystalline thin film structure bonded to an amorphous substrate according to a wafer-to-wafer bonding technique, as depicted in FIGS. 2A-2C.

FIG. 3 illustrates a method 300 for manufacturing a crystalline thin film structure bonded to an amorphous substrate according to a wafer-to-wafer bonding technique, as depicted in FIGS. 2A-2C. A providing operation 305 provides a template wafer including two crystalline template layers separated by a release layer. The thicker of the crystalline template layers provides a structure for transporting the thinner of the two crystalline template layers. The release layer provides a way of selectively releasing the thicker crystalline template layer from the thinner crystalline template layer.

A bonding operation 310 bonds the template wafer to the recording head wafer. More specifically, the thinner of the two crystalline template layers of the template wafer is bonded to the recording head wafer. The bonding operation 310 may be accomplished by using an adhesive, and/or applying heat and/or pressure, for example. A dissolving operation 315 dissolves or otherwise releases the release layer from the recording head wafer. The dissolving operation 315 may be accomplished by selectively etching the release layer without substantially etching the other layers using an aqueous hydrofluoric acid solution (e.g., at about 10% concentration), for example.

A removing operation 320 removes the thicker crystalline template layer from the recording head wafer leaving the thinner crystalline template layer attached to the recording head wafer. With the bonding layer released, the removing operation 320 may be accomplished without damaging the thinner crystalline template layer. A deposition operation 325 deposits an epitaxial magnetic crystalline layer on the thin crystalline template layer of the recording head wafer (e.g., a write pole). Since the crystalline template layer and the epitaxial magnetic crystalline layer are both crystalline, the deposition operation 320 works effectively with the thin crystalline template layer and the epitaxial crystalline layer aligned. Removing operation 320 may also be referred to as separating a first thinner part of the crystalline template layer from a second thicker part of the crystalline template layer.

In an example implementation, when a recording head is formed, the reader is applied before the write pole at a temperature of approximately 220 degrees Celsius. As a result, when the write pole is applied to the recording head, the processing temperature may not exceed 220 degrees Celsius to avoid damaging the reader. As a result, if the deposition process of the crystalline write pole is to exceed 220 degree Celsius (e.g., 500-700 degrees Celsius), a processing techniques that does not directly deposit the crystalline write pole to the recording head wafer may be used, as depicted and described with regard to in FIGS. 4A-5. This allows for more flexibility is choosing an appropriate crystalline write pole material (e.g., FeN, rare-earth transition metallic alloys, and multilayers of rare-earths and transition metals).

FIG. 4A illustrates a side view of a template wafer 430 with a crystalline magnetic epitaxial layer 428 deposited on a template crystalline substrate 434 (e.g., GaAs, Si, GaN, and MgO). In an example implementation, the crystalline magnetic epitaxial layer 428 is deposited on the template crystalline substrate 434 at a temperature that exceeds that which the reader will tolerate (e.g., 220 degrees Celsius). The relatively thick template crystalline substrate 434 (e.g., 100-1000 μm) provides a surface on which the crystalline magnetic epitaxial layer 428 may be deposited and facilitates transportation of the relatively thin (e.g., 50-300 nm) crystalline magnetic epitaxial layer 428 without damaging the crystalline magnetic epitaxial layer 428. Further, the crystalline magnetic epitaxial layer 428 may be deposited on the template crystalline substrate 434 at a relatively high temperature (e.g., up to 700 Celsius) that may damage other magnetic components of a recording head wafer (see recording head wafer 424 of FIG. 4D) if applied directly to the recording head wafer.

FIG. 4B illustrates a side view of the template wafer 430 of FIG. 4A with the crystalline magnetic epitaxial layer 428 patterned into islands with etched voids underneath. In one implementation, etching streets (e.g., etching street 448) are patterned (e.g., using photolithography) in a continuous or non-continuous grid pattern in the crystalline magnetic epitaxial layer 428, which forms the islands. Further, a majority of the template crystalline substrate 434 is etched away immediately underneath each of the islands using the etching streets as access to the underside of the islands. The etching creates the etched voids (e.g., void 438) underneath the islands. Some of the template substrate 434 immediately underneath each of the islands may remain to keep the islands in place. This remaining material may be referred to as an anchor tab(s) (e.g., anchor tab 450). In other implementations, a release layer oriented between the crystalline magnetic epitaxial layer 428 and the template crystalline substrate 434 is used in addition to or in lieu of the patterning and/or etching illustrated in FIG. 4B.

FIG. 4C illustrates a side view of a flexible stamp 440 attached to and pulling the individual islands of the crystalline magnetic epitaxial layer 428 away from the template substrate 434 of FIG. 4B. The flexible stamp 440 is loosely bonded (e.g., via a light adhesive or a release layer (not shown)) that allows it to be removably attached to the individual islands of the crystalline magnetic epitaxial layer 428. The stamp 440 lifts the individual islands of the crystalline magnetic epitaxial layer 428 from the template substrate 434, as illustrated by arrow 442.

The etched voids facilitate the removal of the individual islands of the crystalline magnetic epitaxial layer 428 from the template wafer 430 by providing very little of the template substrate 434 remaining immediately beneath each of the individual islands of the crystalline magnetic epitaxial layer 428. In one implementation, a separation force is applied to the stamp 440 and the template substrate 434, which is sufficient to break the anchor tab(s) connecting the individual islands of the crystalline magnetic epitaxial layer 428 to the template substrate 434. However, the separation force is insufficient to remove the individual islands of the crystalline magnetic epitaxial layer 428 from the stamp 440.

FIG. 4D illustrates a side view of the flexible stamp 440 placing the individual islands of the crystalline magnetic epitaxial layer 428 of FIG. 4C onto a recording head wafer 424, as illustrated by arrow 444. The crystalline magnetic epitaxial layer 428 islands are then bonded or stamped to the recording head wafer 424. For example, the recording head wafer 424 may include an adhesive layer 452 that bonds the crystalline magnetic epitaxial layer 428 islands to the recording head wafer 424 on contact, with the application of pressure, and/or with the application of an elevated temperature. In other implementations, the crystalline magnetic epitaxial layer 428 islands are directly bonded to the recording head wafer 424 without the adhesive layer 452. This process may occur at temperatures within that which the reader will tolerate (e.g., less than 220 degrees Celsius).

FIG. 4E illustrates a side view of the individual islands of the crystalline magnetic epitaxial layer 428 bonded to the amorphous recording head wafer 424 of FIG. 4D with the flexible stamp 440 removed, as illustrated by arrow 446. The flexible stamp 440 is released from the crystalline magnetic epitaxial layer 428, which leaves the individual islands for the crystalline magnetic epitaxial layer 428 attached to the recording head wafer 424 via the adhesive layer 452. In one implementation, a separation force is applied to the stamp 440 and the recording head wafer 424, which is sufficient to break the bonds connecting the individual islands of the crystalline magnetic epitaxial layer 428 to the stamp 440. However, the separation force is insufficient to remove the individual islands of the crystalline magnetic epitaxial layer 428 from the recording head wafer 424.

The technique illustrated by FIGS. 4A-4E may be referred to herein as a hybrid pick-and-place bonding technique. Further, the recording head wafer 424 may have a significantly different area than the template wafer 430 (e.g., the template wafer may be a 4 inch circular wafer, while the recording head wafer 424 may be an 8 inch circular wafer). Since the flexible stamp 440 may be used to place the islands of the crystalline magnetic epitaxial layer 428 on the recording head wafer 424 multiple times at different places on the surface of the recording head wafer 424, the technique illustrated by FIGS. 4A-4E may be used with a variety of template and recording head wafer sizes.

Figure 5:
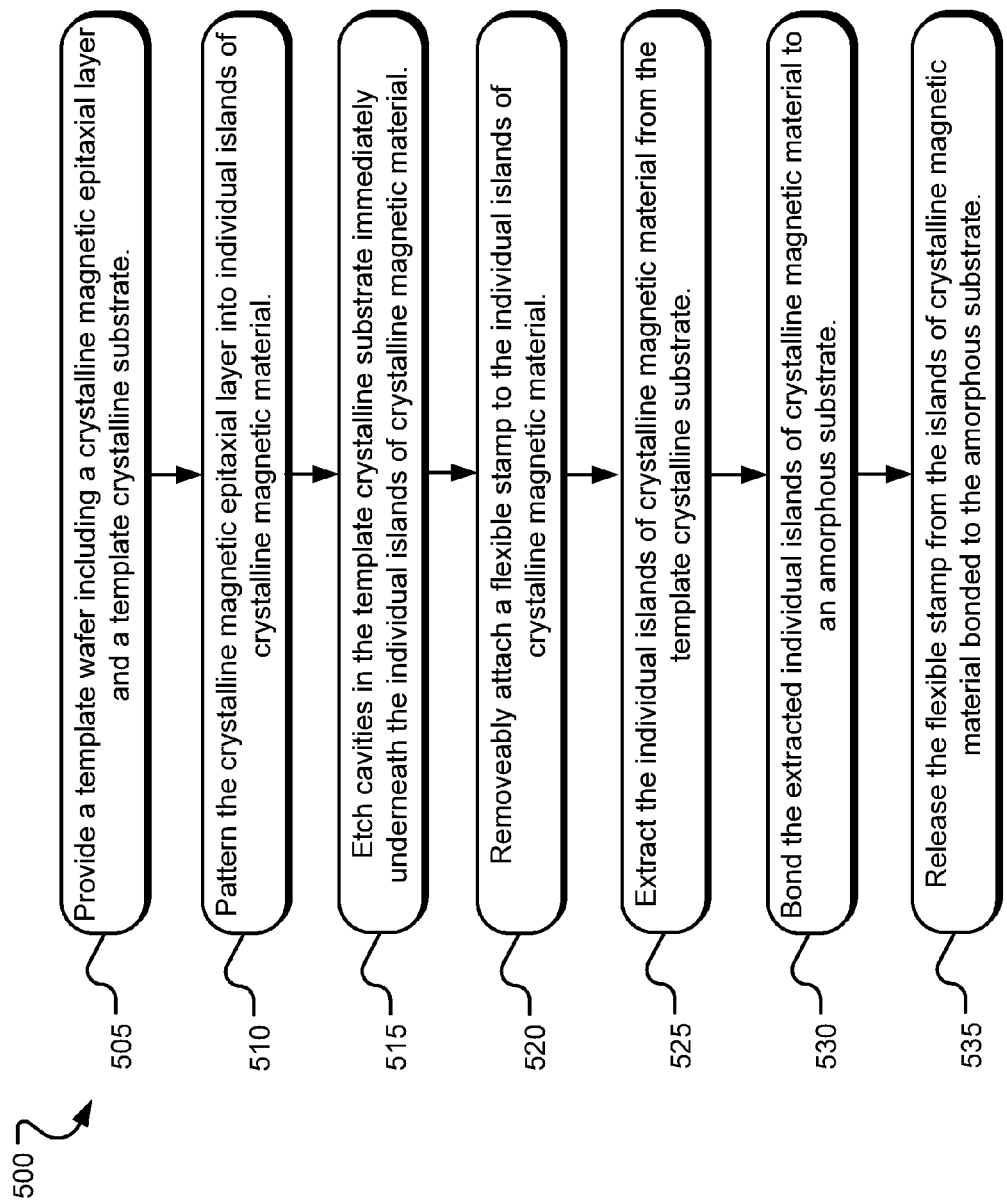
FIG. 5 illustrates operations for manufacturing a crystalline thin film structure bonded to an amorphous substrate according to a hybrid pick-and-place bonding technique, as depicted in FIGS. 4A-4E.

FIG. 5 illustrates a method 500 for manufacturing a crystalline thin film structure bonded to an amorphous substrate according to a hybrid pick-and-place bonding technique, as depicted in FIGS. 4A-4E. A providing operation 505 provides a template wafer including a crystalline magnetic epitaxial layer and a template crystalline substrate. The template crystalline substrate provides a structure for depositing and transporting the crystalline magnetic epitaxial layer. A patterning operation 510 patterns the crystalline magnetic epitaxial layer into individual islands of crystalline magnetic material. In one implementation, the patterning operation 510 forms a continuous or non-continuous grid of trenches or streets separating the individual islands of crystalline magnetic material. In one implementation, the patterning operation 510 is accomplished using photolithography.

An etching operation 515 etches cavities in the template crystalline substrate immediately underneath the individual islands of crystalline magnetic material. An etching solution applied through the grid of trenches or streets etches the template crystalline substrate underneath the individual islands of crystalline magnetic material without substantially affecting the crystalline magnetic epitaxial layer itself. In one implementation, the cavities in the template crystalline substrate are selectively etched without substantially etching the other layers or surrounding areas of the template crystalline substrate using an aqueous hydrofluoric acid solution (e.g., at about 10% concentration) selectively applied to the template crystalline substrate.

Further, some of the template crystalline substrate immediately underneath each of the islands may remain to keep the islands in place on the template crystalline substrate. This remaining material may be referred to as an anchor tab(s). An attaching operation 520 removeably attaches a flexible stamp to the individual islands of crystalline magnetic material. The flexible stamp may include a light adhesive or utilize another light bonding technique to removeably attach to the individual islands of crystalline magnetic material.

An extracting operation 525 extracts the individual islands of crystalline magnetic material from the template crystalline substrate. Extracting operation 525 may be accomplished by applying a separation force to the stamp and the template crystalline substrate, which is sufficient to break the anchor tab(s) connecting the individual islands of the crystalline magnetic epitaxial layer to the template crystalline substrate. However, the separation force is insufficient to remove the individual islands of the crystalline magnetic material from the stamp.

A bonding operation 530 bonds the extracted individual islands of crystalline magnetic material to an amorphous substrate (e.g., a recording head wafer). The bonding operation 530 may be accomplished by placing an adhesive layer between the individual islands of crystalline magnetic material and the amorphous substrate. Applying pressure and/or an elevated temperature may assist the bonding operation 530.

A releasing operation 535 releases the flexible stamp from the islands of crystalline magnetic material bonded to the amorphous substrate. The releasing operation 535 may be accomplished by applying separation force to the stamp and the amorphous substrate, which is sufficient to break the bonds connecting the individual islands of the crystalline magnetic material to the stamp. However, the separation force is insufficient to remove the individual islands of the crystalline magnetic material from the amorphous substrate.

Figure 7:
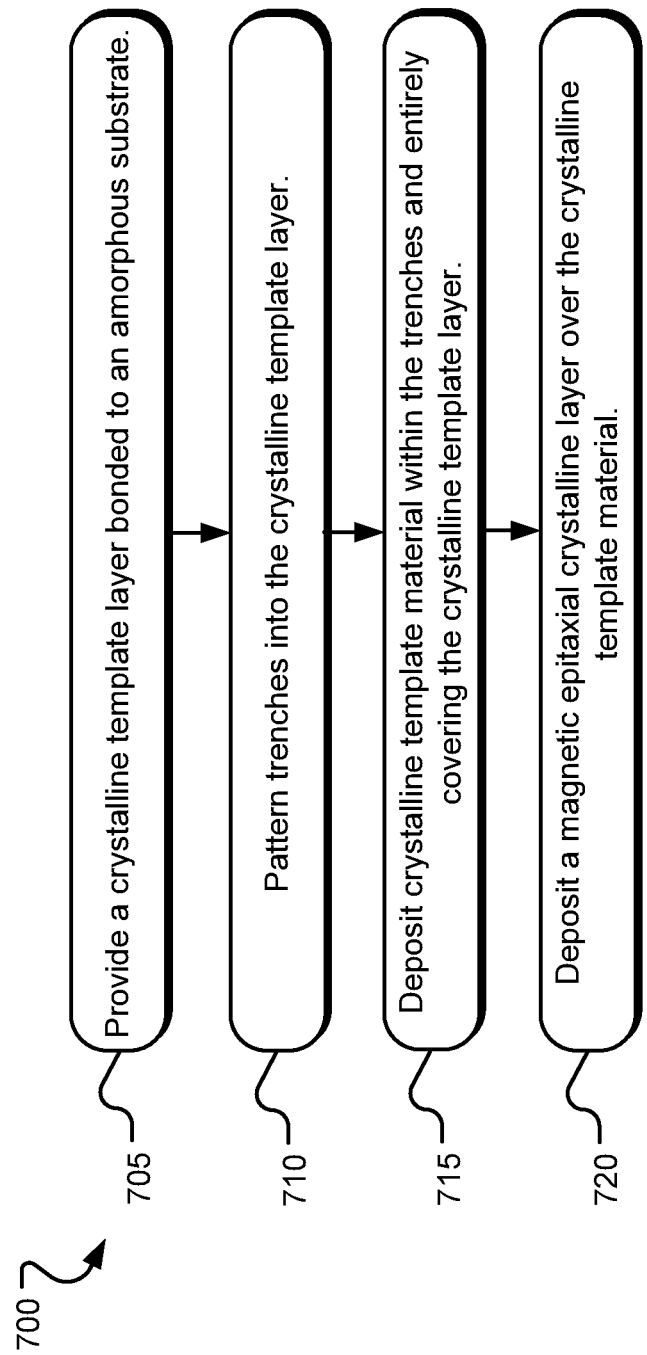
FIG. 7 illustrates operations for manufacturing a crystalline thin film structure bonded to an amorphous substrate according to an aspect ratio trapping lithography technique, as depicted in FIGS. 6A-6D.

A problem with depositing a crystalline layer with a first lattice constant on a crystalline, polycrystalline, or amorphous substrate with a second different lattice constant is that defects occur at the interface of the crystalline layer and the substrate and propagate through the crystalline layer as it is deposited on the substrate. FIGS. 6A-7 illustrate and describe trapping such defects in trenches such that the crystalline layer becomes defect free as it is deposited and its thickness exceeds the depth of the trenches.

FIG. 6A illustrates a side view of a crystalline template layer 628 bonded to an amorphous recording head wafer 624, the crystalline template layer 628 having trenches (e.g., trench 652) patterned therein. The crystalline template layer 628 having trenches patterned therein may be referred to herein as a first part of the crystalline template. The crystalline template layer 628 may be bonded to the recording head wafer 624 using a variety of techniques including that depicted in FIGS. 2A, 2B and 2C and described with regard to operations 305-320 of FIG. 3. The trenches are patterned or etched into the crystalline template layer 628 in order to trap crystalline defects when crystalline template material (see crystalline template material 654 of FIG. 6B) is directly deposited on the recording head wafer 624. In one implementation, etching solution is selectively applied to the crystalline template layer 628 to form the trenches.

FIG. 6B illustrates a side view of the amorphous recording head wafer 624 of FIG. 6A with the trenches in the crystalline template layer 628 filled with a deposited crystalline template material 654. The crystalline template material 654, which may be referred to herein as the second epitaxial part of the crystalline template, grows naturally at an angle within each of the trenches.

The aspect ratio for the height to width of the trenches is typically greater than 1 and the minimum aspect ratio will depend on the angle at which the crystalline template material 654 grows within the trenches, which in turn depends on the growth rate and type of crystalline defects in the crystalline template material 654. Generally, the ability of the aspect ratio trapping process to reduce defects is improved with increased aspect ratios (e.g., an aspect ratio of 1.3).

As a result, the lattice mismatch between the amorphous recording head wafer 624 and the crystalline template material 654 deposited within the trenches is trapped within the trenches by the side walls of the trenches. By the time the deposited crystalline template material 654 reaches the top of the trenches, any crystalline defects that originated at the interface between the deposited crystalline template material 654 and the recording head wafer 624 are no longer present in the deposited crystalline template material 654.

FIG. 6C illustrates a side view of the amorphous recording head wafer 624 of FIG. 6B with a deposited template layer 654 covering the crystalline template layer 628. The template layer 654 may be referred to herein as a third epitaxial part of the crystalline template. The template layer 654 is deposited until the crystalline template layer 628 is completely covered and a minimum thickness of the deposited template layer 654 exists for depositing an epitaxial magnetic write pole (see write pole 618 of FIG. 6D).

FIG. 6D illustrates a side view of the recording head wafer 624 of FIG. 6C with an epitaxial magnetic write pole 618 deposited thereon. Since the deposited template layer 654 surface is free from significant crystalline defects, the epitaxial magnetic write pole 618 may be deposited directly on the deposited template layer 654. The technique illustrated by FIGS. 6A-6D may be referred to herein as an aspect ratio trapping lithography technique.

FIG. 7 illustrates a method 700 for manufacturing a crystalline thin film structure bonded to an amorphous substrate according to an aspect ratio trapping lithography technique, as depicted in FIGS. 6A-6D. A providing operation 705 provides a crystalline template layer bonded to an amorphous substrate (e.g., a recording head wafer). The providing operation 705 may be accomplishing using a variety of techniques including, for example, by performing operations 305-320 of FIG. 3. A patterning operation 710 patterns trenches into the crystalline template layer. The trenches may be arranged in a grid pattern or merely a series of parallel spaced-apart trenches. The trenches may be formed by selectively etching or patterning the surface of the crystalline template layer using an etching agent.

A first deposition operation 715 deposits crystalline template material within the trenches and entirely covering the crystalline template layer. The crystalline template material grows naturally at an angle within each of the trenches. As a result, lattice mismatch between the recording head wafer and the crystalline template material deposited within the trenches is trapped within the trenches by the side walls of the trenches. By the time the deposited crystalline template material covers the top of the trenches, any crystalline defects that originated at the interface between the deposited crystalline template material and the recording head wafer are no longer present. A second deposition operation 720 deposits a magnetic epitaxial crystalline layer over the crystalline template material. Since the deposited template layer surface is free from significant crystalline defects, the magnetic epitaxial crystalline layer may be deposited directly on the crystalline template material.

The logical operations making up the embodiments of the invention described herein are referred to variously as operations, steps, objects, or modules. Furthermore, it should be understood that logical operations may be performed in any order, adding or omitting operations as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A method of manufacturing an article, the method comprising:
   attaching one or more epitaxial crystalline layers to an amorphous substrate by:
   bonding a nonmagnetic crystalline template layer to the amorphous substrate;
   patterning trenches in the nonmagnetic crystalline template layer bonded to the amorphous substrate; and
   depositing additional nonmagnetic crystalline template material within the patterned trenches and over the nonmagnetic crystalline template, prior to depositing a magnetic epitaxial crystalline layer on the nonmagnetic crystalline template layer, wherein the magnetic moment of the article is greater than 2.4 Tesla.

2. The method of claim 1, wherein the bonding includes bonding a first part of the nonmagnetic crystalline template layer having a thickness of less than 300 nm to the amorphous substrate.

3. The method of claim 2, further comprising:
   separating the first part of the nonmagnetic crystalline template layer from a second part of the nonmagnetic crystalline template layer having a thickness of greater than 100 micrometers prior to the depositing step.

4. The method of claim 3, wherein the separating comprises dissolving a release layer between the first part and the second part of the nonmagnetic crystalline template layer.

5. The method of claim 1, wherein depositing additional nonmagnetic crystalline template material comprises depositing the additional nonmagnetic crystalline template material with an angled growth mode that traps defects caused by depositing the additional nonmagnetic crystalline template material directly on the amorphous substrate within the patterned trenches.

6. The method of claim 1, further comprising:
   depositing a magnetic epitaxial crystalline layer on a nonmagnetic crystalline template layer; and
   extracting the magnetic epitaxial crystalline layer from the nonmagnetic crystalline template layer, prior to the attaching operation.

7. The method of claim 6, wherein the extracting and attaching operations are accomplished using a flexible stamp removably attached to the magnetic epitaxial crystalline layer.

8. The method of claim 6, further comprising:
   patterning the deposited magnetic epitaxial crystalline layer into individual islands of magnetic material; and
   etching away nonmagnetic crystalline template material underneath the individual islands of magnetic material, prior to the extracting operation.

9. The method of claim 8, wherein the attaching operation includes bonding the individual islands of magnetic material to the amorphous substrate.

10. A method of manufacturing an article, the method comprising:
    attaching a nonmagnetic crystalline template layer comprising gallium arsenide directly to the amorphous substrate; and
    depositing a magnetic epitaxial crystalline layer on the nonmagnetic crystalline template layer, wherein the magnetic moment of the article is greater than 2.4 Tesla.

11. The method of claim 10, wherein attaching the nonmagnetic crystalline template layer comprises attaching a nonmagnetic crystalline template layer comprising:
    a first part bonded to the amorphous substrate with trenches patterned therein;
    a second epitaxial part deposited within the patterned trenches of the first part; and
    a third epitaxial part deposited over the first part and the second epitaxial part, wherein defects within the second epitaxial part do not propagate to the third epitaxial part.

12. The method of claim 11, wherein the second epitaxial part is deposited within the patterned trenches of the first part with an angled growth mode that traps defects caused by depositing the second epitaxial part directly on the amorphous substrate within the patterned trenches.

13. The method of claim 11, wherein the magnetic epitaxial crystalline layer is deposited on the third epitaxial part of the nonmagnetic crystalline template layer.

14. A method of manufacturing an article, the method comprising:
- providing a template wafer comprising a crystalline magnetic epitaxial layer and a template crystalline substrate;
- patterning the crystalline magnetic epitaxial layer into individual islands of crystalline magnetic material;
- removing the individual islands of crystalline magnetic material from the template crystalline substrate; and
- bonding the removed individual islands of crystalline magnetic material to an amorphous substrate.

15. The method of claim 14, further comprising:
- after patterning and before removing the individual islands of crystalline magnetic material, etching cavities in the template crystalline substrate immediately proximate to the individual islands of magnetic material.

16. The method of claim 15, further comprising:
- after etching cavities in the template crystalline substrate, removably attaching a flexible stamp to the individual islands of crystalline magnetic material; and
- releasing the flexible stamp from the individual islands of crystalline magnetic material after bonding the removed individual islands of crystalline magnetic material to an amorphous substrate.

17. The method of claim 14, wherein a magnetic moment of the article of manufacture is greater than 2.4 Tesla.

* * * * *